(12) United States Patent
Kim

(10) Patent No.: US 7,236,397 B2
(45) Date of Patent: Jun. 26, 2007

(54) REDUNDANCY CIRCUIT FOR NAND FLASH MEMORY DEVICE

(75) Inventor: Eui Suk Kim, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 11/010,515

(22) Filed: Dec. 13, 2004

(65) Prior Publication Data

US 2005/0254320 A1 Nov. 17, 2005

(30) Foreign Application Priority Data

May 11, 2004 (KR) .................. 10-2004-0033199

(51) Int. Cl.
*G11C 16/06* (2006.01)
*G11C 29/24* (2006.01)
*G11C 15/00* (2006.01)
*G11C 7/10* (2006.01)

(52) U.S. Cl. ............ 365/185.09; 365/200; 365/189.05; 365/185.17; 365/49

(58) Field of Classification Search ........... 365/185.09, 365/185.11, 185.17, 230.03, 200, 49, 189.05
See application file for complete search history.

(56) References Cited

U.S. PATENT DOCUMENTS 5,265,055 A * 11/1993 Horiguchi et al. .......... 365/200
5,347,484 A * 9/1994 Kwong et al. ................ 365/49
5,434,814 A * 7/1995 Cho et al. ............. 365/185.13
6,307,787 B1 10/2001 Al-Shamma
6,813,184 B2 * 11/2004 Lee ...................... 365/185.09
2003/0133340 A1* 7/2003 Lee ............................ 365/200

FOREIGN PATENT DOCUMENTS

KP  2002-0069731  9/2002
KP  2003-0020410  3/2003

OTHER PUBLICATIONS

Office action for Korean patent application No. 2004-33199 filed May 11, 2004.

* cited by examiner

*Primary Examiner*—J. H. Hur
(74) *Attorney, Agent, or Firm*—Marshall, Gerstein & Borun LLP

(57) ABSTRACT

A redundancy circuit for a NAND flash memory device reduces a test time and production time of the device, by performing a redundancy operation through a repair select unit using a cam cell. In addition, the redundancy circuit employs a repair method using a redundancy cam which can perform the repair operation much faster than a general repair method using fuse cutting.

2 Claims, 4 Drawing Sheets

REDUNDANCY CIRCUIT FOR NAND FLASH MEMORY DEVICE

This application relies for priority upon Korean Patent Application No. 2004-0033199 filed May 11, 2004, the contents of which are herein incorporated by reference in their entirety.

BACKGROUND

1. Technical Field

The present patent relates to a redundancy circuit for a NAND flash memory device, and more particularly to, an address redundancy circuit using a repair cam circuit.

2. Discussion of Related Art

A general NAND flash memory device performs a repair operation according to fuse cutting. The fuse must be cut by using a laser. If coordinates, thickness and topology of the fuse are mistakenly calculated, the fuse is not normally cut. Accordingly, the repair operation is not effective.

SUMMARY

The present patent is directed to a redundancy circuit for a NAND flash memory device which can overcome disadvantages of a general redundancy method using a fuse, by performing a repair operation by using a redundancy cam.

One aspect of the present invention is to provide a redundancy circuit for a NAND flash memory device, including: a plurality of main cell blocks in which a plurality of memory cells are connected, for storing data; a redundancy cell block for repairing the memory cells of the main cell blocks; a main page buffer unit for sensing the data of the memory cells of the main cell blocks, or buffering external data and applying the buffered data to the main cell blocks; a redundancy page buffer unit for sensing the data of the memory cells of the redundancy cell block, or buffering the external data and applying the buffered data to the redundancy cell block; a cam cell unit for storing information on the repaired address, and outputting a predetermined redundancy control signal; and a repair select unit for applying the external data to the main page buffer unit or the redundancy page buffer unit according to the redundancy control signal.

Preferably, the repair select unit includes: a latch for latching a predetermined signal; a first NMOS transistor connected to a first input terminal of the latch, for controlling the signal of the latch according to the redundancy control signal; a second NMOS transistor connected to a second input terminal of the latch, for resetting the latch according to an external cam reset signal; a third NMOS transistor for transmitting the external data to the main page buffer unit according to the first input terminal of the latch; and a fourth NMOS transistor for transmitting the external data to the redundancy page buffer unit according to the second input terminal of the latch.

Preferably, each of the main page buffer unit and the redundancy page buffer unit includes: a main page buffer for applying predetermined data to the memory cells, and receiving data from the memory cells; and a cache page buffer for receiving the external data from the repair select unit, and applying the data to the main page buffer.

DETAILED DESCRIPTION

Figure 1:
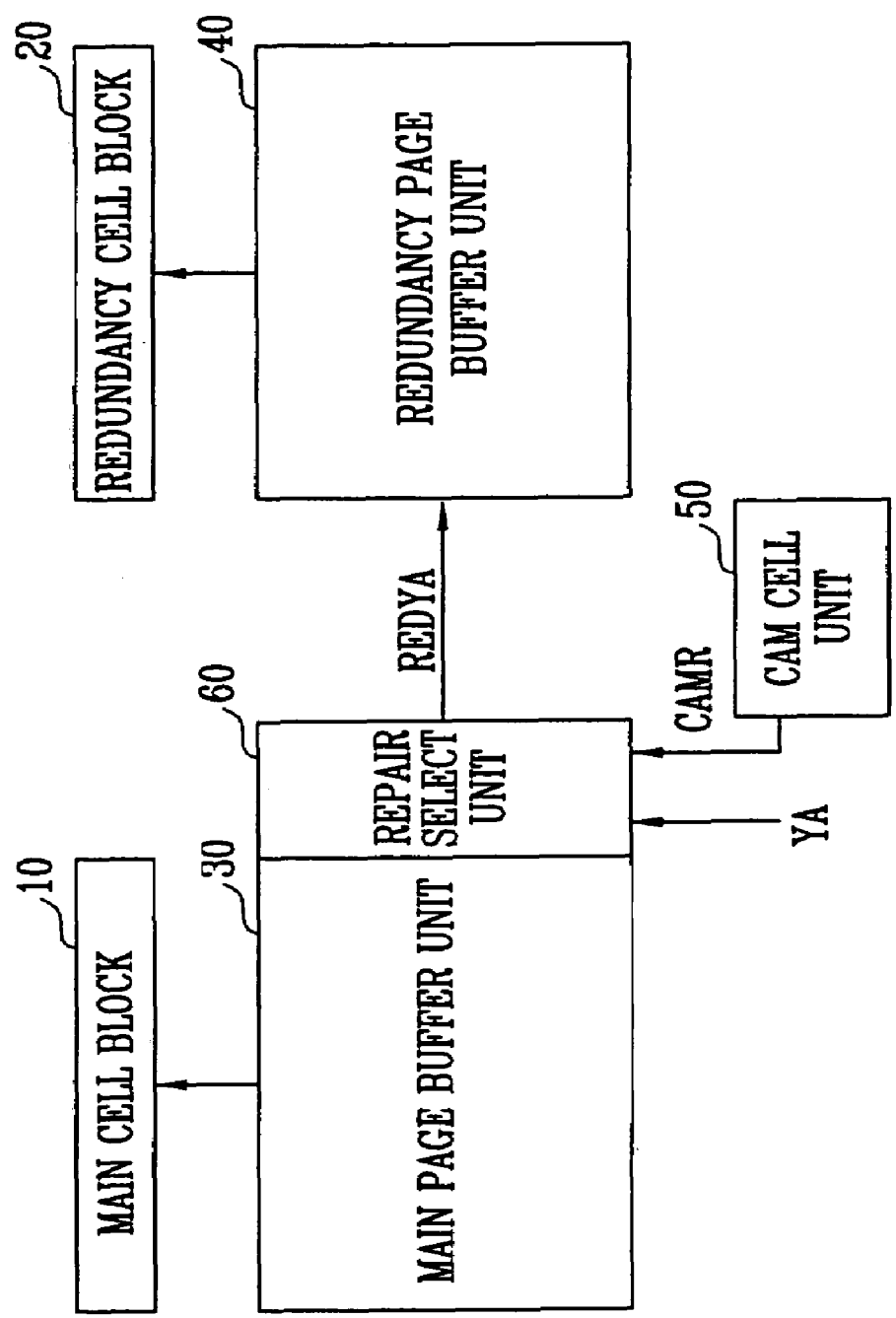
FIG. 1 is a block diagram illustrating an exemplary redundancy circuit.

An exemplary redundancy circuit for a NAND flash memory device is described in detail with reference to the accompanying drawings. The exemplary disclosed herein embodiment can be modified in various forms, which is not intended to be limiting. Wherever possible, the same reference numerals will be used throughout the drawings and the description to refer to the same or like parts.

FIG. 1 is an exemplary block diagram illustrating the redundancy circuit. Referring to FIG. 1, the redundancy circuit for the NAND flash memory device includes a plurality of main cell blocks 10 in which a plurality of memory cells are connected, for storing data, a redundancy cell block 20 for repairing the memory cells of the main cell blocks 10, a main page buffer unit 30 for sensing the data of the memory cells of the main cell blocks 10, or buffering external data and applying the buffered data to the main cell blocks 10, a redundancy page buffer unit 40 for sensing the data of the memory cells of the redundancy cell block 20, or buffering external data and applying the buffered data to the redundancy cell block 20, a cam cell unit 50 for storing information on the repaired address, and outputting a predetermined redundancy control signal REDYA, and a repair select unit 60 for applying the external data to the main page buffer unit 30 or the redundancy page buffer unit 40 according to the redundancy control signal REDYA.

Each of the main cell blocks 10 and the redundancy cell block 20 includes a plurality of cell strings (not shown) in which a plurality of memory cells are formed in a string type, a plurality of drain select transistors (not shown) for selecting drain terminals of the cell strings, a plurality of source select transistors (not shown) for selecting source terminals of the cell strings, a plurality of bit lines (not shown) connected respectively to the drain select transistors, and a plurality of word lines (not shown) connected respectively to gate terminals of the cell strings. In addition, each of the main cell blocks 10 and the redundancy cell block 20 may further include a plurality of bit line select transistors (not shown) for applying information of the main page buffer unit 30 to the bit lines, or applying information of the bit lines to the main page buffer unit 30 according to a bit line select signal. Preferably, the bit line select transistors are formed in pairs, for controlling even or odd bit lines, respectively. Furthermore, each of the main cell blocks 10 and the redundancy cell block 20 may further include a plurality of discharge transistors (not shown) for applying a virtual voltage to the bit lines according to a discharge signal. Preferably, the pair of discharge transistors are connected to the even and odd bit lines, for applying a ground power to the bit lines.

Figure 2:
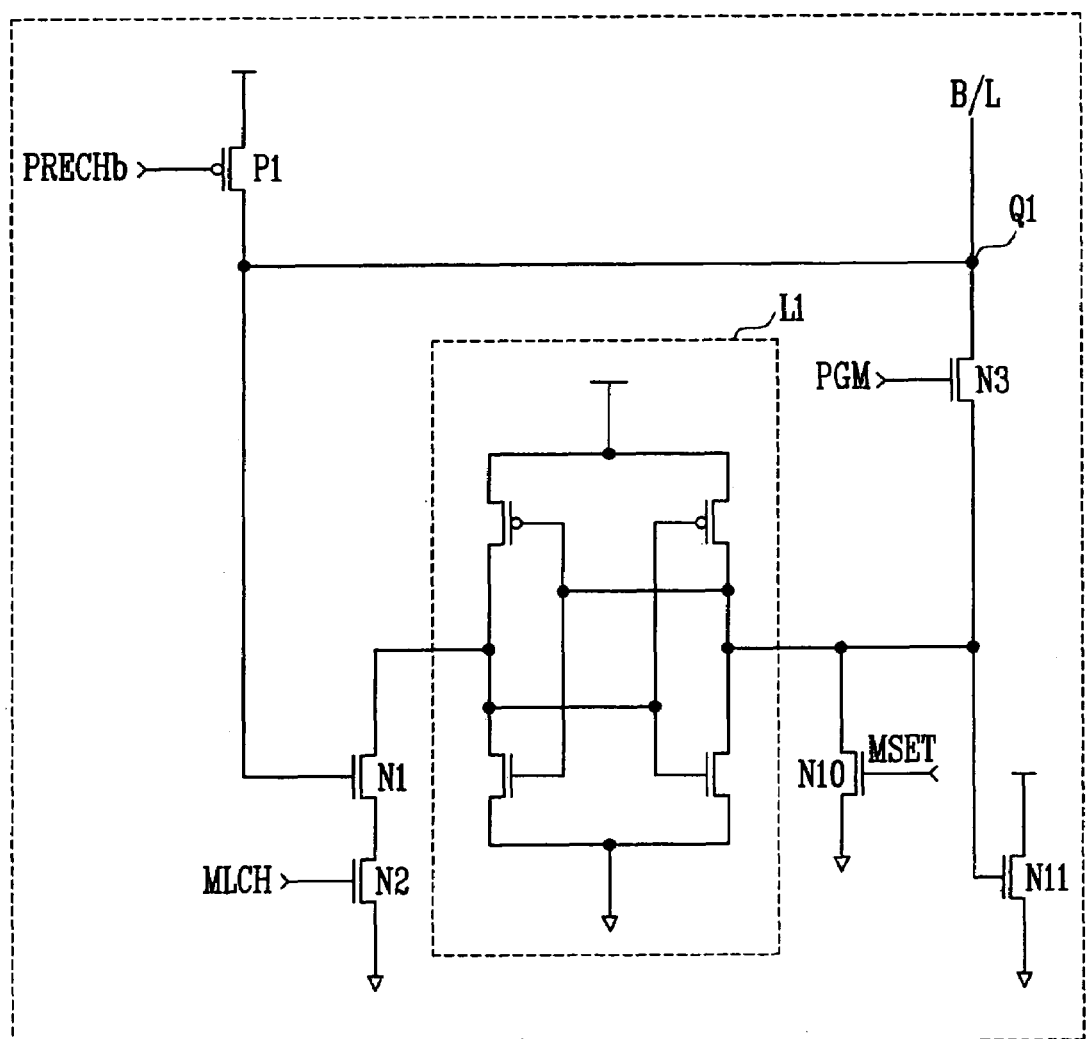
FIGS. 2 and 3 are circuit diagrams illustrating an exemplary main page buffer unit or a redundancy page buffer unit.
Figure 3:
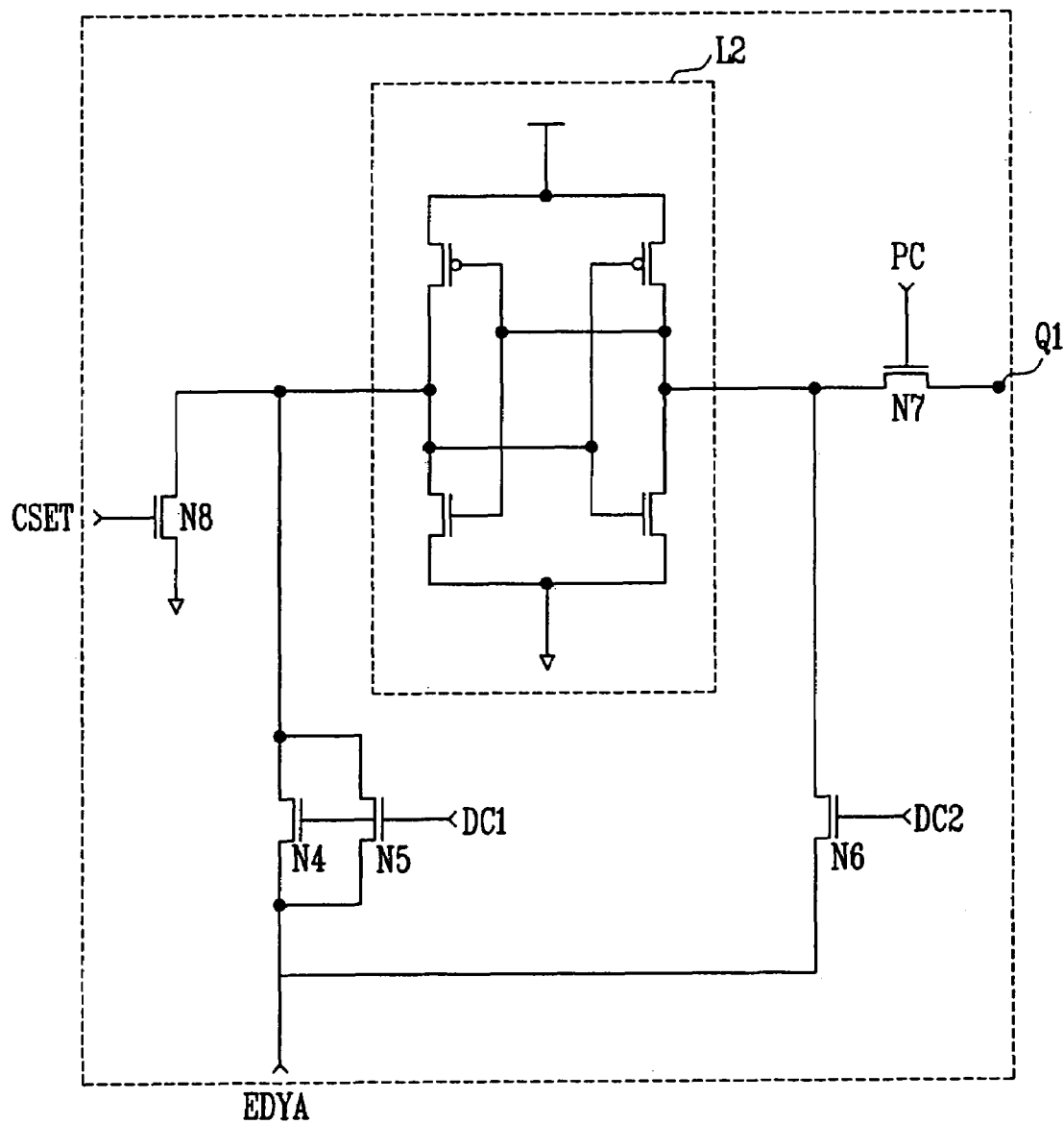

FIGS. 2 and 3 are circuit diagrams illustrating the exemplary main page buffer unit or the redundancy page buffer unit. As illustrated in FIGS. 2 and 3, each of the main page buffer unit 30 and the redundancy page buffer unit 40 includes a main page buffer for applying predetermined data to the bit lines, and receiving data from the bit lines, and a cache page buffer for receiving the external data from the repair select unit 60, and applying the data to the main page buffer. The main page buffer includes a precharge node Q1 connected to the bit line, a first latch L1 for storing and latching the external data and the data of the bit line, a first PMOS transistor P1 for precharging the precharge node Q1 according to a precharge enable signal PRECHb, first and second NMOS transistors N1 and N2 respectively driven according to the precharge node Q1 and an external latch signal MLCH, for changing a latch value of the first latch L1, and a third NMOS transistor N3 connected between the first latch L1 and the precharge node Q1 and operated according to a program signal PGM.

The main page buffer may further include a $10^{th}$ NMOS transistor N10 for resetting the first latch L1 according to an external reset control signal MSET, and an $11^{th}$ NMOS transistor N11 driven according to the data value of the first latch L1, for transmitting a power voltage. In addition, the main page buffer may further include a $12^{th}$ NMOS transistor (not shown) for transmitting the external data of the repair select unit 60 to one input terminal of the first latch L1 according to a precoding signal.

The cache page buffer includes a second latch L2 for storing external data, fourth and fifth NMOS transistors N4 and N5 for transmitting the external data EDYA of the repair select unit 60 to the second latch. L2 according to an external first data control signal DC1, a sixth NMOS transistor N6 for transmitting the external data EDYA of the repair select unit 60 to the second latch L2 according to an external second data control signal DC2, and a seventh NMOS transistor N7 for transmitting the data latched by the second latch L2 to the main page buffer according to a program control signal PC. The cache page buffer may further include an eighth NMOS transistor N8 for resetting the second latch L2 according to a cache reset signal CSET. In addition, the cache page buffer may include a $20^{th}$ NMOS transistor (not shown) connected in series between an input terminal of the second latch L2 and the ground power, and driven according to the signal of the precharge node Q1 or the external data of the repair select unit 60, and a $21^{st}$ NMOS transistor (not shown) driven according to an external control signal.

Figure 4:
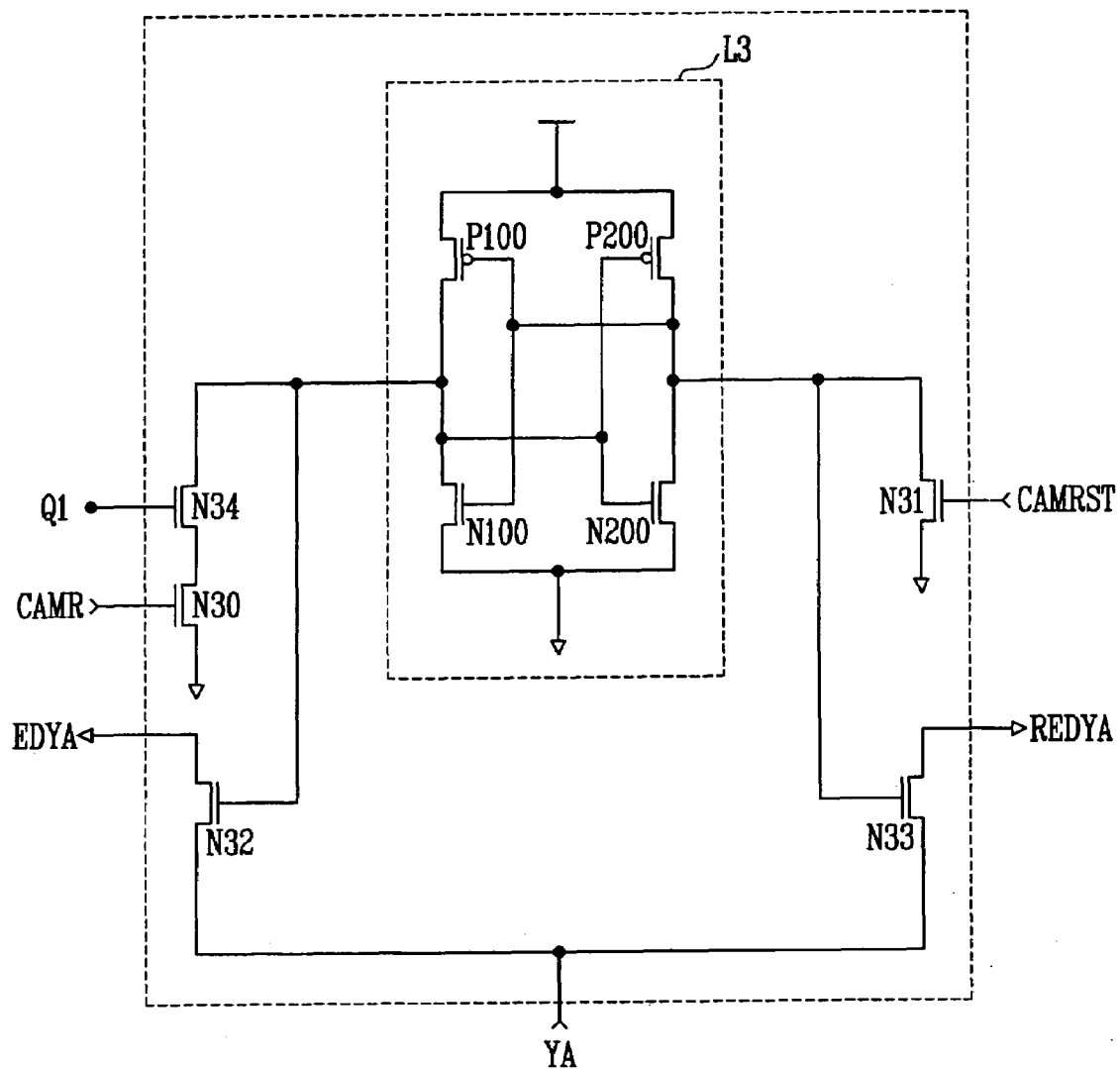
FIG. 4 is a circuit diagram illustrating an exemplary repair select unit.

FIG. 4 is a circuit diagram illustrating the exemplary repair select unit.

As shown in FIG. 4, the repair select unit 60 includes a third latch L3 for latching a predetermined signal, a $30^{th}$ NMOS transistor N30 connected to a first input terminal of the third latch L3, for controlling the signal of the third latch L3 according to an external redundancy control signal CAMR, a $31^{st}$ NMOS transistor N31 connected to a second input terminal of the third latch L3, for resetting the third latch L3 according to an external cam reset signal CAMRST, a $32^{nd}$ NMOS transistor N32 for transmitting the external data EDYA to the main page buffer unit 30 according to the first input terminal of the third latch L3, and a $33^{rd}$ NMOS transistor N33 for transmitting the external data REDYA to the redundancy page buffer unit 40 according to the second input terminal of the third latch L3. The repair select unit 60 further includes a $34^{th}$ NMOS transistor N34 driven according to the bit lines between one input terminal of the third latch L3 and the $30^{th}$ NMOS transistor N30.

Preferably, the latch is formed so that inputs and outputs of two inverters can be alternately arranged. The latch includes a $100^{th}$ PMOS transistor P100 connected between the power voltage and the first input terminal and driven according to the second input terminal, a $100^{th}$ NMOS transistor. N100 connected between the first input terminal and the ground power and driven according to the second input terminal, a $200^{th}$ PMOS transistor P200 connected between the power voltage and the second input terminal and driven according to the first input terminal, and a $200^{th}$ NMOS transistor N200 connected between the second input terminal and the ground power and driven according to the first input terminal.

The operation of the exemplary redundancy circuit will now be explained. When power is applied to the device, the redundancy control signal CAMR is generated by reading the data of the cam cell unit 50. When an external power-up signal is applied, the plurality of circuits are reset. When the redundancy control signal CAMR is logic low, the $30^{th}$ NMOS transistor N30 is turned off, and thus the third latch L3 maintains an initial reset value. That is, the first input terminal of the third latch L3 maintains logic high, and the second input terminal thereof maintains logic low. Accordingly, the $32^{nd}$ NMOS transistor N32 is turned on, the $33^{rd}$ NMOS transistor N33 is turned off, and thus a predetermined data is transmitted to the main page buffer unit 30 by an external Y-decoder.

If the redundancy control signal CAMR becomes logic high and the external address is repaired, the $30^{th}$ NMOS transistor N30 is turned on according to the logic high redundancy control signal CAMR. The first input of the third latch L3 becomes logic low, and thus the second input thereof becomes logic high. Therefore, the $32^{nd}$ NMOS transistor N32 is turned off, the $33^{rd}$ NMOS transistor N33 is turned on, and thus a predetermined data is transmitted to the redundancy page buffer unit 40 by the external Y-decoder.

As discussed earlier, the redundancy circuit for the NAND flash memory device reduces a test time and production time of the device, by performing the redundancy operation through the repair select unit using the cam cell. Furthermore, the redundancy circuit employs the repair method using the redundancy cam which can perform the repair operation much faster than the general repair method using fuse cutting.

Although the present invention has been described in connection with the various embodiments illustrated in the accompanying drawings, it is not limited thereto. It will be apparent to those skilled in the art that various substitutions, modifications and changes may be made thereto without departing from the scope and spirit of the invention.

What is claimed is:

1. A redundancy circuit for a NAND flash memory device, comprising:

a plurality of main cell blocks in which a plurality of memory cells are connected, to store data;

a redundancy cell block to repair the memory cells of the main cell blocks;

a main page buffer unit to sense the data of the memory cells of the main cell blocks, or to buffer external data and apply the buffered data to the main cell blocks;

a redundancy page buffer unit to sense the data of the memory cells of the redundancy cell block, or buffer the external data and apply the buffered data to the redundancy cell block;

a content addressable memory(CAM) cell unit to store information on a repaired address, and output a redundancy control signal; and a repair select unit to apply the external data to the main page buffer unit or the redundancy page buffer unit according to the redundancy control signal, the repair select unit comprising:

a latch to latch a predetermined signal;

a first NMOS transistor connected to a first input terminal of the latch, to control the signal of the latch according to the redundancy control signal;

a second NMOS transistor connected to a second input terminal of the latch, to reset the latch according to an external content addressable memory(CAM) reset signal;

a third NMOS transistor to transmit the external data to the main page buffer unit according to the first input terminal of the latch; and a fourth NMOS transistor to transmit the external data to the redundancy page buffer unit according to the second input terminal of the latch.

2. The redundancy circuit of claim 1, wherein each of the main page buffer unit and the redundancy page buffer unit comprises:

a main page buffer to apply predetermined data to the memory cells, and receive data from the memory cells; and a cache page buffer to receive the external data from the repair select unit, and apply the data to the main page buffer.

* * * * *